(12) United States Patent
Hoshi et al.

(10) Patent No.: US 9,894,761 B2
(45) Date of Patent: Feb. 13, 2018

(54) PREPREG, METAL-CLAD LAMINATED PLATE AND PRINTED WIRING BOARD

(71) Applicant: Panasonic Intellectual Property Management Co., Ltd., Osaka (JP)

(72) Inventors: Takashi Hoshi, Fukushima (JP); Takeshi Kitamura, Hyogo (JP); Keiko Kashihara, Osaka (JP); Hiroharu Inoue, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/173,697

(22) Filed: Jun. 5, 2016

(65) Prior Publication Data

US 2016/0366761 A1 Dec. 15, 2016

(30) Foreign Application Priority Data

Jun. 12, 2015 (JP) ................. 2015-119103

(51) Int. Cl.
*H05K 1/03* (2006.01)
*H05K 1/02* (2006.01)
(Continued)

(52) U.S. Cl.
CPC .............. *H05K 1/0366* (2013.01); *C08J 5/24* (2013.01); *H05K 1/0271* (2013.01);
(Continued)

(58) Field of Classification Search
CPC ....... C08J 5/24; C08J 2433/08; C08J 2363/00
See application file for complete search history.

(56) References Cited

U.S. PATENT DOCUMENTS

| | | | | |
|---|---|---|---|---|
| 2005/0234173 A1* | 10/2005 | Tsuchikawa | ............... | C08J 5/24 524/415 |
| 2009/0008127 A1* | 1/2009 | Motobe | ............. | C08G 59/3254 174/250 |
| 2014/0367150 A1* | 12/2014 | Inoue | ......................... | C08J 5/24 174/255 |

FOREIGN PATENT DOCUMENTS

| | | |
|---|---|---|
| JP | 2006-137942 | 6/2006 |
| JP | 2007-138152 | 6/2007 |

(Continued)

*Primary Examiner* — Randy P Gulakowski
*Assistant Examiner* — Ha S Nguyen
(74) *Attorney, Agent, or Firm* — Greenblum & Bernstein, P.L.C.

(57) ABSTRACT

A prepreg includes a resin composition including: (A) at least one of an epoxy resin having a naphthalene skeleton and a phenolic hardener having a naphthalene skeleton; (B) a polymer having at least the structures of formulae (2) and (3) among formulae (1), (2) and (3) and having a weight-average molecular weight of from 200,000 to 850,000 inclusive; and (C) an inorganic filler:

(Continued)

-continued

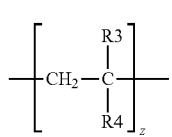
(3)

wherein x:y:z (molar fraction)=0:0.95:0.05 to 0.2:0.6:0.2 (where $x+y+z \leq 1$, $0 \leq x \leq 0.2$, $0.6 \leq y \leq 0.95$, $0.05 \leq z \leq 0.2$); R1 represents a hydrogen atom or a methyl group and R2 includes at least one of a glycidyl group and an epoxidized alkyl group among a hydrogen atom, an alkyl group, a glycidyl group and an epoxidized alkyl group in formula (2); and R3 represents a hydrogen atom or a methyl group and R4 represents Ph (phenyl group), —COOCH$_2$Ph or —COO(CH$_2$)$_2$Ph in formula (3).

7 Claims, 2 Drawing Sheets

(51) Int. Cl.
  *C08J 5/24* (2006.01)
  *C08G 59/62* (2006.01)
  *C08L 63/00* (2006.01)
(52) U.S. Cl.
  CPC ............ *H05K 1/0373* (2013.01); *C08G 59/62* (2013.01); *C08J 2363/00* (2013.01); *C08J 2433/08* (2013.01); *C08L 63/00* (2013.01); *H05K 2201/0133* (2013.01); *H05K 2201/0209* (2013.01); *H05K 2201/029* (2013.01); *H05K 2201/0224* (2013.01)

(56) References Cited

FOREIGN PATENT DOCUMENTS

JP      2008-007756      1/2008
WO   WO 2014050034 A1 * 4/2014 ............... C08J 5/24

* cited by examiner

PREPREG, METAL-CLAD LAMINATED PLATE AND PRINTED WIRING BOARD

BACKGROUND

1. Field of the Invention

The present disclosure relates to a prepreg, a metal-clad laminated plate formed by using the prepreg, and a printed wiring board formed by using the metal-clad laminated plate.

2. Description of the Related Art

Conventionally, a prepreg is formed by impregnating a woven fabric base material with a resin composition containing a thermosetting resin, and then heating and drying the woven fabric base material until the resin composition comes into a semi-cured state (see, for example, Unexamined Japanese Patent Publication No. 2006-137942, Unexamined Japanese Patent Publication No. 2007-138152 and Unexamined Japanese Patent Publication No. 2008-007756). A metal-clad laminated plate can be produced by laminating a metal foil on the thus formed prepreg. Further, a printed wiring board can be produced by forming a conductive pattern to the metal-clad laminated plate. Thereafter, a semiconductor element is mounted on the printed wiring board, and sealed to produce a package.

Packages that have been commonly used in smart phones and tablet PCs in recent years include PoP (Package on Package). In the PoP, a plurality of sub-packages are laminated, and therefore mountability of sub-packages and electrical conduction reliability for each sub-package are important. The mountability and conduction reliability are improved by decreasing the absolute value of warpage of a package (including sub-packages) at room temperature. The mountability and conduction reliability are improved by decreasing the amount of change in warpage of a package when the ambient temperature is changed from room temperature to 260° C. Accordingly, development of a substrate material which ensures a reduction in warpage of a package is extensively conducted.

SUMMARY

A prepreg according to the present disclosure includes a resin composition and a woven fabric base material, the resin composition including:

(A) at least one of an epoxy resin having a naphthalene skeleton and a phenolic hardener having a naphthalene skeleton;

(B) a polymer having at least the structures of formulae (2) and (3) among formulae (1), (2) and (3) and having a weight-average molecular weight of from 200,000 to 850,000 inclusive; and (C) an inorganic filler:

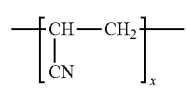

(1)

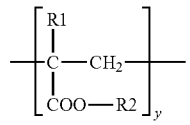

(2)

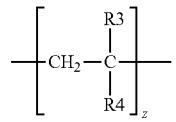

(3)

wherein x:y:z (molar fraction)=0:0.95:0.05 to 0.2:0.6:0.2 (where x+y+z≤1, 0≤x≤0.2, 0.6≤y≤0.95, 0.05≤z≤0.2); R1 represents a hydrogen atom or a methyl group and R2 includes at least one of a glycidyl group and an epoxidized alkyl group among a hydrogen atom, an alkyl group, a glycidyl group and an epoxidized alkyl group in formula (2); and R3 represents a hydrogen atom or a methyl group and R4 represents Ph (phenyl group), —COOCH$_2$Ph or —COO(CH$_2$)$_2$Ph in formula (3).

In the prepreg, a ratio of a loss elastic modulus to a storage elastic modulus is preferably 0.05 or more at a temperature of 60° C. or lower and at a temperature of 200° C. or higher in a cured state.

In the prepreg, a tensile elongation in a direction inclined by 45° with respect to a warp yarn or a weft yarn in the woven fabric base material is preferably 5% or more in a cured state.

A metal-clad laminate plate according to the present disclosure includes: an insulating layer that is a cured product of the prepreg; and a metal foil provided on the insulating layer.

A printed wiring board according to the present disclosure includes: an insulating layer that is a cured product of the prepreg; and a conductive pattern provided on the insulating layer.

According to the present disclosure, warpage of a package can be reduced, and heat resistance with moisture absorption can be improved.

DETAILED DESCRIPTION OF THE PREFERRED EMBODIMENT

Problems of conventional printed wiring boards will be described before an embodiment of the present disclosure is described.

Materials developed with a view to high rigidity and a low coefficient of thermal expansion are currently proposed as substrate materials which ensure a reduction in warpage of a package. The proposal is based on the assumption that warpage of the package is reduced as the rigidity of the substrate material increases and the coefficient of thermal expansion (CTE) of the substrate material decreases.

The materials having high rigidity and a low coefficient of thermal expansion have been confirmed to have an effect of reducing warpage in certain package forms, but they exhibit an utterly different warpage behavior in different package forms. Therefore, the materials having high rigidity and a low coefficient of thermal expansion are poor in versatility.

When the thickness of an insulating layer is less than 0.2 mm in a printed wiring board to be used for production of a package, the moisture content of the insulating layer is low because the thickness of the insulating layer is small. Accordingly, even when absorbed moisture is heated in soldering etc., only a small amount of moisture is evaporated, and therefore swelling of the insulating layer can be suppressed by the strength of the resin that forms the insulating layer.

However, when the thickness of the insulating layer is 0.2 mm or more, an amount of moisture absorbed in the insulating layer is high because the thickness of the insulating layer is large. Accordingly, when absorbed moisture is heated and evaporated in soldering etc., a resin that forms the insulating layer is broken, leading to swelling of the insulating layer. Thus, in particular, a conventional printed wiring board having a large thickness has low heat resistance with moisture absorption.

The present disclosure has been devised in view of the situations described above, and provides a prepreg, a metal-clad laminated plate and a printed wiring board which are capable of reducing warpage of a package and improving heat resistance with moisture absorption.

Hereinafter, the embodiment of the present disclosure will be described.

Figure 1:
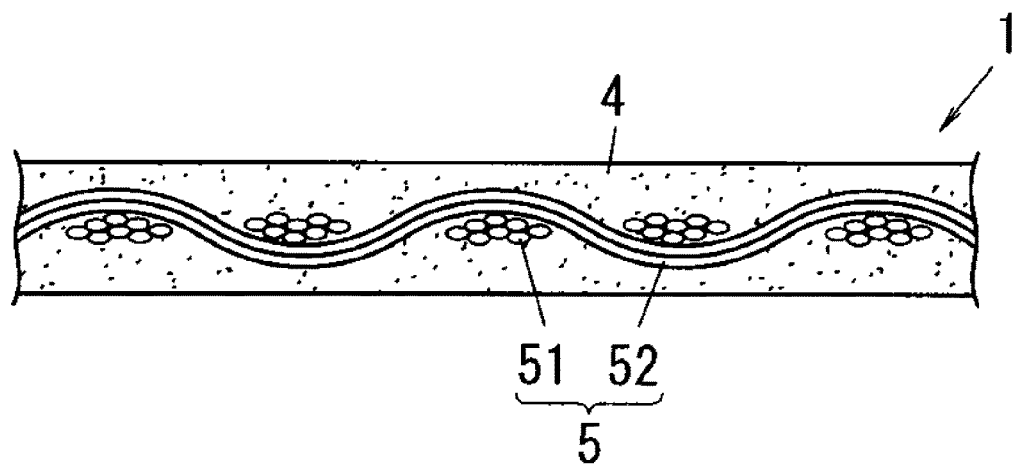
FIG. 1 is a schematic sectional view showing one example of a prepreg.

Prepreg 1 of this embodiment is formed of resin composition 4 in a semi-cured state, and woven fabric base material 5 as shown in FIG. 1. Specifically, prepreg 1 is formed by impregnating woven fabric base material 5 with resin composition 4 in a varnish state (A stage state), and heating and drying woven fabric base material 5 until resin composition 4 comes into a semi-cured state (B stage state).

Resin composition 4 contains component (A), component (B) and component (C) as shown below. Particularly component (A) and component (B) are preferably phase-separated rather than being compatible with each other in resin composition 4 in a semi-cured state and a cured state. Accordingly, a decrease in glass transition temperature (Tg) of a cured product of resin composition 4 can be suppressed in order to improve the heat resistance (e.g. soldering heat resistance) of a package.

Component (A) is a matrix resin that is a high-rigidity component. Specifically, component (A) is at least one of an epoxy resin having a naphthalene skeleton and a phenolic hardener having a naphthalene skeleton. In other words, component (A) may contain both an epoxy resin having a naphthalene skeleton (hereinafter, also referred to as a "naphthalene-type epoxy resin") and a phenolic hardener having a naphthalene skeleton (hereinafter, also referred to as a "naphthalene-type phenolic hardener"). Component (A) may contain an epoxy resin having no naphthalene skeleton, and a naphthalene-type phenolic hardener. Component (A) may contain a naphthalene-type epoxy resin, and a phenolic hardener having no naphthalene skeleton. When at least one of the epoxy resin and the phenolic hardener has a naphthalene skeleton as described above, the heat resistance of the package can be improved. Here, "naphthalene skeleton" may be represented by "naphthalene framework".

Component (B) is a low-elastic-modulus component. Specifically, component (B) is, for example, an epoxy-modified acrylic resin, and has at least the structures represented by formulae (2) and (3) among the formulae (1), (2) and (3);

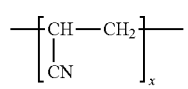

(1)

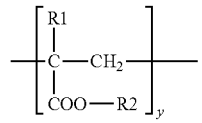

(2)

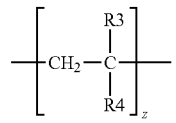

(3)

wherein x:y:z (molar fraction)=0:0.95:0.05 to 0.2:0.6:0.2 (where x+y+z≤1, 0≤x≤0.2, 0.6≤y≤0.95, 0.05≤z≤0.2); R1 represents a hydrogen atom or a methyl group and R2 includes at least one of a glycidyl group and an epoxidized alkyl group among a hydrogen atom, an alkyl group, a glycidyl group and an epoxidized alkyl group in formula (2); and R3 represents a hydrogen atom or a methyl group and R4 represents Ph (phenyl group), —COOCH$_2$Ph or —COO(CH$_2$)$_2$Ph in formula (3).

Specifically, the main chain of component (B) has at least the structures of formulae (2) and (3) among the formulae (1), (2) and (3).

When the main chain of component (B) has the structures of formulae (1), (2) and (3), the sequence of the structures of formulae (1), (2) and (3) is not particularly limited. Here, in the main chain of component (B), the structures of formula (1) may be or may not be continuously linked together. The structures of formula (2) may be or may not be continuously linked together. The structures of formula (3) may be or may not be continuously linked together.

When the main chain of component (B) has the structures of formulae (2) and (3), the sequence of the structures of formulae (2) and (3) is not particularly limited. Here, in the main chain of component (B), the structures of formula (2) may be or may not be continuously linked together. The structures of formula (3) may be or may not be continuously linked together.

The structure of formula (3) has Ph (phenyl group), —COOCH$_2$Ph or —COO(CH$_2$)$_2$Ph. Since Ph, —COOCH$_2$Ph or —COO(CH$_2$)$_2$Ph is thermally stable, the strength of a cured product of resin composition 4 is increased, so that the heat resistance with moisture absorption to a laminated plate (metal-clad laminated plate and printed wiring board) can be improved.

Preferably, component (B) does not have an unsaturated bond such as a double bond or a triple bond between carbon atoms. In other words, it is preferable that carbon atoms in component (B) are bonded together through a saturated bond (single bond). When the component has an unsaturated bond between carbon atoms, it may be oxidized with time to lose elasticity, and thus become brittle.

Component (B) is a polymer having a weight-average molecular weight (Mw) in a range of from 200,000 to 850,000 inclusive. The value of the weight-average molecular weight has two significant digits. Values which will be rounded to 200,000 or 850,000 when the third digit (digit in the thousandth place) is rounded are also included in the above-mentioned range. When the weight-average molecular weight of component (B) is less than 200,000, chemical resistance is deteriorated. Conversely, when the weight-average molecular weight of component (B) is more than 850,000, formability is deteriorated. The weight-average molecular weight (Mw) of component (B) is preferably in the range of from 300,000 to 500,000 inclusive.

When resin composition 4 contains component (B), a cured product of resin composition 4 is hard to absorb moisture, so that moisture resistance of the laminated plate can be improved, and insulation reliability can be improved. Even if a cured product of resin composition 4 absorbs moisture, the heat resistance with moisture absorption to the laminated plate can be improved because the breaking strength of the resin that forms the cured product is increased. Particularly, even in the case of a thick printed wiring board in which the thickness of an insulating layer is 0.2 mm or more, swelling of the insulating layer due to heating in soldering etc. can be suppressed because heat resistance with moisture absorption is improved. Needless to say, in the case of a thin printed wiring board in which the thickness of an insulating layer is less than 0.2 mm, heat resistance with moisture absorption is improved.

The epoxy value of component (B) is preferably in the range of from 0.06 eq/kg to 0.8 eq/kg inclusive. The epoxy value is an equivalent number of epoxy groups existing per 1 kg of component (B). When the epoxy value of component (B) is in the above-mentioned range, component (A) and component (B) are hard to be compatible with each other, and a decrease in glass transition temperature (Tg) of the laminated plate is suppressed, so that the heat resistance of the package can be improved. The epoxy value of component (B) is more preferably in the range of from 0.06 eq/kg to 0.40 eq/kg inclusive.

Component (C) is an inorganic filler. The inorganic filler is not particularly limited, and examples thereof may include spherical silica, barium sulfate, silicon oxide powders, pulverized silica, baked talc, barium titanate, titanium oxide, clay, alumina, mica, boehmite, zinc borate, zinc stannate, and other metal oxides and metal hydroxides. When resin composition 4 contains an inorganic filler, the dimensional stability of the laminated plate can be improved.

Preferably, component (C) is surface-treated with a silane coupling agent of represented by the formula (4).

$$(R6)Si(R5)_3 \quad (4)$$

In the formula (4), R5 represents a methoxy group or an ethoxy group, and R6 represents an aliphatic alkyl group with a carbon number of from 3 to 18 inclusive, the aliphatic alkyl group having a methacryl group, a glycidyl group or an isocyanate group at an end thereof.

The silane coupling agent represented by formula (4) is a trifunctional alkoxysilane in which an aliphatic alkyl group with a specific carbon number is bonded to a silicon atom, the aliphatic alkyl group having a specific functional group (methacryl group, glycidyl group or isocyanate group) at an end thereof. Examples of the silane coupling agent having a methacryl group at an end of the aliphatic alkyl group may include 3-methacryloxypropyltrimethoxysilane and 3-methacryloxyoctyltrimethoxysilane. Examples of the silane coupling agent having a glycidyl group at an end of the aliphatic alkyl group may include 3-glycidoxypropyltrimethoxysilane and 3-glycidoxyoctyltrimethoxysilane. Examples of the silane coupling agent having an isocyanate group at an end of the aliphatic alkyl group may include 3-isocyanatopropyltrimethoxysilane. After the inorganic filler is surface-treated with the silane coupling agent, an aliphatic alkyl group with a specific carbon number exists on the surface of the inorganic filler.

The aliphatic alkyl group serves to relax stress developed in thermal expansion or thermal shrinkage of cured prepreg 1. When the inorganic filler is surface-treated with the silane coupling agent, a stress relaxation layer derived from the aliphatic alkyl group is formed on the surface of the inorganic filler. When the inorganic filler having a stress relaxation layer exists in component (A) and component (B), an effect of relaxing stress caused by thermal expansion and thermal shrinkage is exhibited. As a result, cured prepreg 1 containing the inorganic filler is hard to be thermally deformed. Accordingly, the heat resistance with moisture absorption to the laminated plate can be further improved. There may be several reasons why existence of the aliphatic alkyl group on the surface of the inorganic filler produces a stress relaxing effect. One of the reasons is that the single bond of the alkyl group can freely rotate, so that the alkyl group of the inorganic filler can be thermally expanded or thermally shrunk of the inorganic filler along with thermal expansion or thermal shrinkage of component (A) and component (B).

Further, the aliphatic alkyl group serves to reduce the etching amount in a desmearing treatment after perforation of metal-clad laminated plate 2 formed with prepreg 1 as a material. The aliphatic alkyl group has a methacryl group, a glycidyl group or an isocyanate group at an end thereof, and the functional group is strongly bonded to component (A) and component (B), so that the desmearing etching amount can be reduced. The desmearing etching amount can be reduced as compared to a case where the aliphatic alkyl group does not have any of a methacryl group, a glycidyl group and an isocyanate group at an end thereof.

The carbon number of the aliphatic alkyl group (R6) in the silane coupling agent represented by formula (4) is preferably from 3 to 18 inclusive. When the carbon number of the aliphatic alkyl group (R6) is 3 or more, an excessive increase in elasticity of cured prepreg 1 can be suppressed.

Examples of the method for surface-treating the inorganic filler with the silane coupling agent may include a direct treatment method, an integral blending method and a dry concentration method. The amount of the silane coupling agent added to the inorganic filler for surface-treating the inorganic filler with the silane coupling agent is not particularly limited. The amount of the silane coupling agent necessary for forming a monomolecular layer of the silane coupling agent over the whole surface layer of the inorganic filler can be calculated from the following equation (5). The preferred added amount of the silane coupling agent is between 0.1 and 15 times (inclusive) as large as a value calculated from this equation. In this case, the stress relaxing effect by the inorganic filler is more efficiently exhibited.

$$W_C = W_F \times S_F / S_C \quad (5)$$

$W_C$: amount of silane coupling agent necessary for formation of monomolecular layer (g)
$W_F$: added amount of inorganic filler (g)
$S_F$: specific surface area of inorganic filler (m²/g)
$S_C$: least coverage area of silane coupling agent (m²/g)

Resin composition 4 may contain a curing accelerator. Examples of the curing accelerator may include imidazoles and derivatives thereof, organic phosphorus-based compounds, metal soaps such as zinc octoate, secondary amines, tertiary amines and quaternary ammonium salt.

The mass ratio of component (A) and component (B) in resin composition 4 is preferably 90:10 to 50:50, more preferably 80:20 to 60:40. In component (A), the ratio of the hydroxyl group equivalent of the phenolic hardener to the epoxy equivalent of the epoxy resin is preferably in the range of from 0.2 to 1.1 inclusive. The content of component (C) is preferably 80% by mass or less, more preferably 50% by mass or less to the total amount of resin composition 4.

When component (C) is surface-treated with the silane coupling agent, the content of component (C) here is a content of surface-treated component (C) including the silane coupling agent.

Resin composition 4 can be prepared by blending component (A), component (B), component (C), and a curing accelerator as necessary. And a varnish of resin composition 4 can be prepared by diluting resin composition 4 with a solvent. Examples of the solvent may include ketone-based solvents such as acetone, methyl ethyl ketone, aromatic solvents such as toluene and xylene, and nitrogen-containing solvents such as dimethylformamide.

Figure 2:
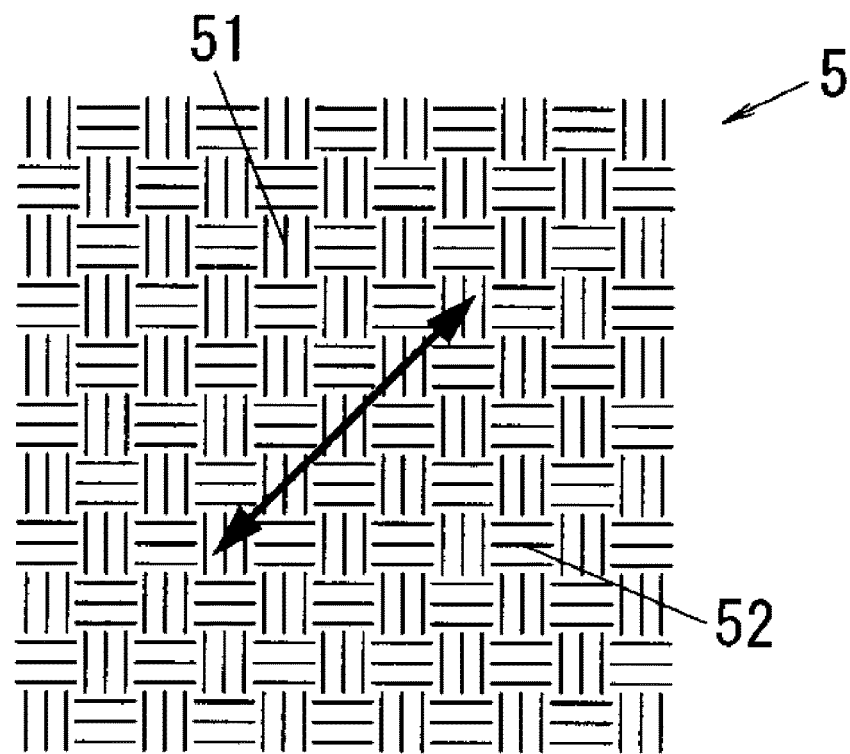
FIG. 2 is a schematic plan view showing one example of a woven fabric base material.

Woven fabric base material 5 is not particularly limited as long as it is woven such that warp yarn 51 and weft yarn 52 are almost orthogonal to each other as in a plain fabric as shown in FIG. 2, and examples thereof may include woven fabrics composed of inorganic fibers, such as glass cloths, and woven fabrics composed of organic fibers, such as aramid cloths. The thickness of woven fabric base material 5 is preferably in the range of from 10 μm to 200 μm inclusive.

Prepreg 1 can be produced by impregnating woven fabric base material 5 with resin composition 4, and then heating and drying woven fabric base material 5 until resin composition 4 comes into a semi-cured state.

In prepreg 1, the ratio of a loss elastic modulus to a storage elastic modulus (loss tangent tan δ=loss elastic modulus/storage elastic modulus) is preferably between 0.05 and 2.0 (inclusive) at a temperature of from 0° C. to 60° C. inclusive and at a temperature of from 200° C. to 350° C. inclusive in a cured state. The ratio of a loss elastic modulus to a storage elastic modulus is preferably more than 0 and less than 0.05 at a temperature of higher than 60° C. and lower than 200° C. When two loss tangent peaks exist as described above, it is possible to have the characteristics of both component (A) as a high-rigidity component and component (B) as a low-elasticity component. The loss tangent can be measured by use of a dynamic viscoelasiticity measuring device.

In prepreg 1, the tensile elongation in a direction inclined by 45° with respect to warp yarn 51 or weft yarn 52 in woven fabric base material 5 (e.g. a direction shown by the two-way arrow in FIG. 2) is preferably 5% or more in a cured state. The tensile elongation is preferably 50% or less. For measurement of the tensile elongation, a sample obtained by bringing one prepreg 1 into a cured state (C stage state) is normally used. A sample obtained by laminating a plurality of prepregs 1 in such a manner that the directions of warp yarn 51 and the directions of weft yarn 52 are coincide, respectively, and bringing laminated prepregs 1 into a cured state may also be used. The tensile elongation can be measured by a tension test as described below. First, the length ($L_0$) of the sample in a direction inclined by 45° with respect to warp yarn 51 or weft yarn 52 is measured before the tension test. Here, the width of the sample is set to 5 mm. Next, by use of a tension tester, the sample is drawn at a speed of 5 mm/min in a direction inclined by 45° with respect to warp yarn 51 or weft yarn 52, and the length (L) just before the sample is broken is measured. The tensile elongation can be calculated from the following equation (6).

$$\text{Tensile elongation (\%)} = \{(L-L_0)/L_0\} \times 100 \quad (6)$$

When the tensile elongation determined in the manner described above is 5% or more, warpage of the package can be further reduced.

Figure 3:
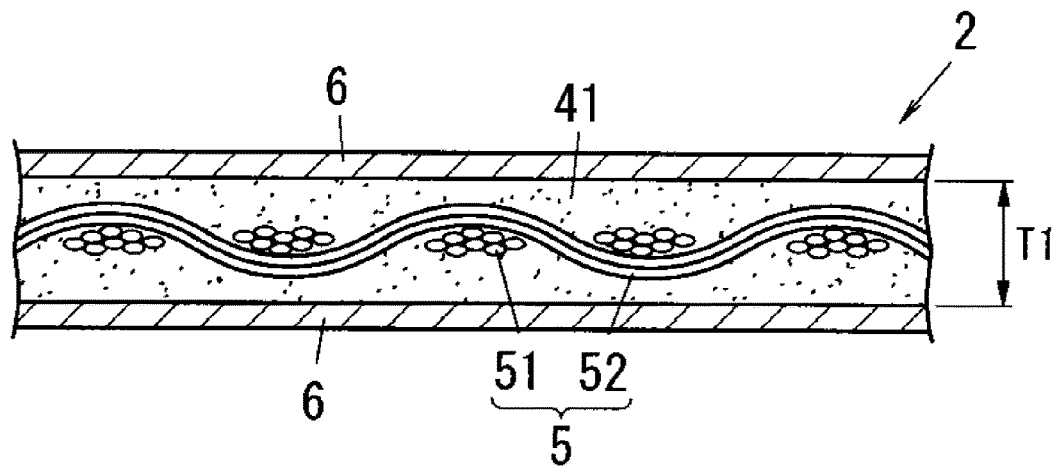
FIG. 3 is a schematic sectional view showing one example of a metal-clad laminated plate.

Metal-clad laminated plate 2 of this embodiment is formed by laminating metal foil 6 on prepreg 1. Specifically, metal-clad laminated plate 2 is formed by bonding metal foil 6 to a surface of insulating layer 41 formed by curing prepreg 1 as shown in FIG. 3. In other words, metal-clad laminated plate 2 includes insulating layer 41 that is a cured product of prepreg 1, and metal foil 6 provided on insulating layer 41. Here, metal-clad laminated plate 2 may be formed by laminating metal foil 6 to one or both of the surfaces of one prepreg, or may be formed by superimposing a plurality of prepregs 1 on one another, and laminating metal foil 6 to one or both of the surfaces thereof. Prepreg 1 in a semi-cured state provides insulating layer 41 in a cured state as described above. Irrespective of whether thickness T1 of insulating layer 41 is less than 0.2 mm or not less than 0.2 mm, the heat resistance with moisture absorption to metal-clad laminated plate 2 can be improved. The upper limit of thickness T1 of insulating layer 41 of metal-clad laminated plate 2 is about 0.4 mm. Metal foil 6 may be, for example, a copper foil. Laminate formation can be performed by heating and pressurization by use of, for example, a multi-stage vacuum press or a double belt press.

Figure 4:
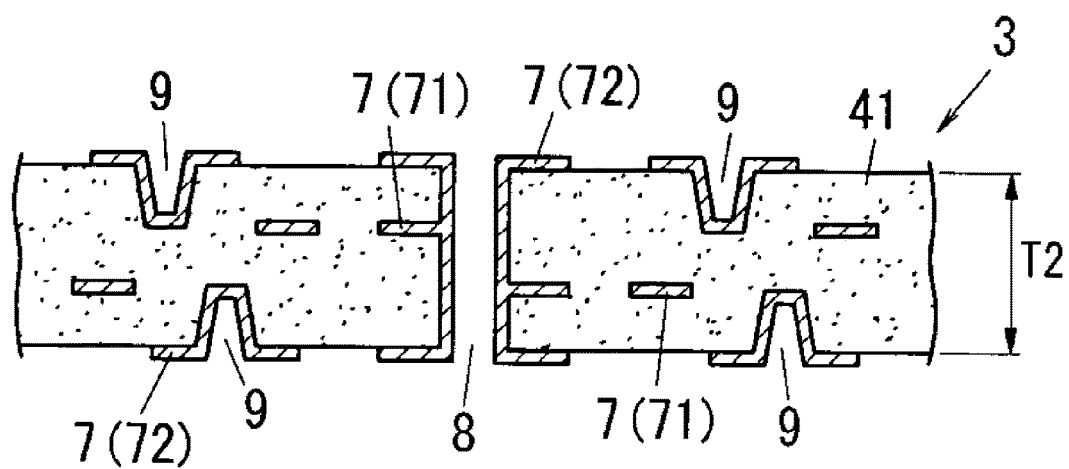
FIG. 4 is a schematic sectional view showing one example of a printed wiring board.

Printed wiring board 3 of this embodiment is provided with conductive pattern 7 formed by removing a part of metal foil 6 of metal-clad laminated plate 2. In other words, printed wiring board 3 includes insulating layer 41 that is a cured product of prepreg 1, and conductive pattern 7 provided on insulating layer 41. Conductive pattern 7 can be formed by, for example, a subtractive method. One example of printed wiring board 3 is shown in FIG. 4. Printed wiring board 3 is a multilayer printed wiring board 3 in which conductive pattern 7 is formed by subtractive method, and multiple layers are stacked by a buildup method. Conductive pattern 7 in insulating layer 41 is inner layer pattern 71, and conductive pattern 7 on the outside surface of insulating layer 41 is outer layer pattern 72. Irrespective of whether thickness T2 of insulating layer 41 here is less than 0.2 mm or not less than 0.2 mm, the heat resistance with moisture absorption to printed wiring board 3 can be improved. The upper limit of thickness T2 of insulating layer 41 in printed wiring plate 3 is about 0.4 mm. In FIG. 4, woven fabric base material 5 is not illustrated.

In formation of conductive pattern 7, insulating layer 41 is perforated for interlayer connection. Interlayer connection is electrical conduction between conductive patterns 7 of different layers. The hole may be a through hole which penetrates through printed wiring board 3, or may be a non-through hole (blind hole) which does not penetrate through printed wiring board 3. As shown in FIG. 4, via hole 8 can be formed by, for example, plating the inner surface of the through hole, and blind via hole 9 can be formed by, for example, plating the inner surface of the non-through hole. Although not illustrated, a buried via hole may be formed. The inner diameter of the hole is, for example, in the range of from 0.01 mm to 0.20 mm inclusive. The depth of the hole is, for example, in the range of from 0.02 mm to 0.80 mm inclusive. Perforation can be performed by drill processing or laser processing.

When insulating layer 41 contains an inorganic filler surface-treated with the silane coupling agent, the desmearing etching amount can be reduced because the functional group at an end of the aliphatic alkyl group in the silane coupling agent is a methacryl group, a glycidyl group or an isocyanate group. Even if a resin smear is generated, the resin smear in the hole can be removed by washing the inside of the hole by a desmearing treatment such as chemical hole cleaning. Accordingly, defect of conduction caused by a resin smear can be eliminated, thus conduction reliability can be improved.

When insulating layer 41 contains an inorganic filler surface-treated with the silane coupling agent, the aliphatic alkyl group in the silane coupling agent serves as a stress relaxation layer. Therefore, printed wiring board 3 can be made to have low elasticity while the coefficient of thermal expansion thereof is reduced. Consequently, high elongation property can be imparted. Accordingly, the heat resistance with moisture absorption to printed wiring board 3 can be further improved.

Thereafter, a semiconductor element can be mounted on printed wiring board 3, and sealed to produce a package such as FBGA (Fine pitch Ball grid Array). A package such as PoP (Package on Package) can also be produced by laminating a plurality of sub-packages with the package used as a sub-package. Thus, packages in various forms can be produced, and for any of the packages, warpage is reduced and heat resistance with moisture absorption is improved owing to component (A) and component (B). Specifically, since rigidity can be increased by component (A), and stress can be relaxed by reducing elasticity by component (B), warpage of the package can be generally reduced irrespective of the form of the package. Further, the heat resistance with moisture absorption to the package can be improved by component (A) and component (B).

EXAMPLES

Hereinafter, the present disclosure will be described in detail by way of examples.
<Blending Raw Materials>
Component (A)
(A-1) Naphthalene-type epoxy resin ("HP-9500" manufactured by DIC Corporation)
(A-2) Naphthalene-type phenolic hardener ("HPC-9500" manufactured by DIC Corporation)
Component (B)
(B-1) Epoxy-modified acrylic resin ("KV-8161" manufactured by Shin-Nakamura Chemical Co., Ltd.)
This component has the structures of formulae (1), (2) and (3) (where R1 represents a hydrogen atom or a methyl group; R2 represents a methyl group, an ethyl group or a butyl group; R3 is a hydrogen atom or a methyl group; and R4 represents —COOCH$_2$Rh). And this component does not have an unsaturated bond between carbon atoms, and has a weight-average molecular weight of 300,000 and an epoxy value of 0.21 eq/kg.
(B-2) Epoxy-modified acrylic resin ("KV-8162" manufactured by Shin-Nakamura Chemical Co., Ltd.)
This component has the structures of formulae (1), (2) and (3) (where R1 represents a hydrogen atom or a methyl group; R2 represents a methyl group, an ethyl group or a butyl group; R3 is a hydrogen atom or a methyl group; and R4 represents —COOCH$_2$Rh). And this component does not have an unsaturated bond between carbon atoms, and has a weight-average molecular weight of 500,000 and an epoxy value of 0.21 eq/kg.
(B-3) Epoxy-modified acrylic resin ("SG-P3 Modified 215 Mw2" manufactured by Nagase ChemteX Corporation.): Comparative Example 1
This component has the structures of formulae (1) and (2) (where R1 represents a hydrogen atom or a methyl group; and R2 represents a methyl group, an ethyl group or a butyl group). And this component does not have an unsaturated bond between carbon atoms, and has a weight-average molecular weight of 500,000 and an epoxy value of 0.21 eq/kg.

Component (C)
(C-1) Silica surface-treated with HTMS
This component is spherical silica surface-treated with hexyl trimethoxy silane (abbreviated as "HTMS") ("SC2500-GFL" manufactured by Admatechs.).
(C-2) Silica surface-treated with IPTES
This component is spherical silica surface-treated with 3-isocyanatepropyltriethoxysilane (abbreviated as "IPTES") ("SC2500-GNO" manufactured by Admatechs.).
(C-3) Spherical silica which is not surface-treated ("SO-25R" manufactured by Admatechs.)
(Others)
Curing accelerator (imidazole: "2E4MZ" manufactured by SHIKOKU CHEMICALS CORPORATION)
Woven fabric base material (glass cloth: "WEA116E" manufactured by Nitto Boseki Co., Ltd.; thickness: 88 μm)
(Prepreg)
Component (A), component (B), component (C) and a curing accelerator were blended each in a blending amount (parts by mass) as shown in Table 1, and the resulting mixture was diluted with a solvent (methyl ethyl ketone) to prepare a varnish of a resin composition. In Examples 1 to 4, component (A) and component (B) are phase-separated rather than being compatible with each other.

Next, the woven fabric base material was impregnated with the resin composition in such a manner that the thickness after curing would be 100 μm, and the woven fabric base material was heated and dried at 130° C. for 6 minutes until the resin composition came into a semi-cured state, thereby producing a prepreg.
(Metal-Clad Laminated Plate)
Two prepregs were laminated with each other, a copper foil (thickness: 12 μm) as a metal foil was laminated to each of both the surfaces thereof, and heating was performed at 220° C. for 60 minutes under a vacuum condition while a pressure of 2.94 MPa (30 kgf/cm$^2$) was applied, thereby producing a copper-clad laminated plate (CCL) as a metal-clad laminated plate. The thickness of an insulating layer in the metal-clad laminated plate was 200 μm.
<Evaluation Items>
The following physical properties were evaluated. The results thereof are shown in Table 1.
(Loss Tangent (Tan δ) and Glass Transition Temperature (Tg))
One prepreg was provided, brought into a cured state, and cut to a size of 50 mm×5 mm to prepare a sample. The loss tangent (tan δ) of the sample was measured with the temperature elevated at a rate of 5° C./min by use of a dynamic viscoelasiticity measuring device ("DMS 6100" manufactured by SII NanoTechnology Corporation). The temperature at which the loss tangent (tan δ) reached the maximum was defined as a glass transition temperature (T$_g$).
(Elastic Modulus)
Eight prepregs were laminated with one another, and heated and pressurized to prepare a sample in a cured state. The elastic modulus of the sample at 25° C. was measured by use of a dynamic viscoelasiticity measuring device ("DMS 6100" manufactured by SII NanoTechnology Corporation).
(Coefficient of Thermal Expansion (CTE))
One prepreg was provided, and brought into a cured state to prepare a sample. The coefficient of thermal expansion (CTE) of the sample in a direction parallel to the weft yarn of the woven fabric base material was measured at a temperature lower than the glass transition temperature (Tg) of a cured product of the resin composition of the sample by a TMA method (Thermal mechanical analysis method) in accordance with JIS C 6481. For the measurement, a thermomechanical analysis device ("TMA/SS6100" manufactured by SII NanoTechnology Corporation) was used.

(Tensile Elongation)

One prepreg was provided, and brought into a cured state to prepare a sample. The tensile elongation was measured by the following tension test. First, the length ($L_0$) of the sample in a direction inclined by 45° with respect to a warp yarn or a weft yarn was measured before the tension test. Here, the width of the sample was set to 5 mm. Next, by use of a tension tester ("AUTOGRAPH AGS-X" manufactured by Shimadzu Corporation), the sample was drawn at a speed of 5 mm/min in a direction inclined by 45° with respect to the warp yarn or the weft yarn, and the length (L) just before the sample was broken was measured. The tensile elongation was calculated from the following equation.

$$\text{Tensile elongation (\%)} = \{(L-L_0)/L_0\} \times 100 \qquad (6)$$

(Tensile Strength)

One prepreg was provided, and brought into a cured state to prepare a sample. The tensile strength was measured by the following tension test. The sample was set in a tension tester ("AUTOGRAPH AGS-X" manufactured by Shimadzu Corporation) with the sample width set to 5 mm and the grip distance set to 60 mm. Thereafter, sample was drawn at a speed of 5 mm/min in a direction inclined by 45° with respect to a warp yarn or a weft yarn, and the strength at which the sample was broken was measured as a tensile strength.

(Test of Heat Resistance with Moisture Absorption)

The metal foil on a surface of the metal-clad laminated plate was removed by etching, and cut to a square shape to prepare test pieces (size: 5 cm×5 cm). The test pieces were placed in an oven at 100° C., and dried for 1 hour as a pretreatment. Thereafter, the test pieces were caused to absorb moisture at a temperature of 121° C., a humidity of 100% and a pressure of 2 atm. (202.7 kPa) for 1 hour, 2 hours and 4 hours. These three kinds of test pieces with different moisture absorption times were immersed in a solder bath at 260° C. for 20 seconds. Whether the test pieces taken out from the solder bath had a swollen part was checked by visual observation. In Table 1, a sample with test pieces having no swollen part is rated "Very Good", a sample with test pieces having a swollen part of 1 mm or less is rated "Good", a sample with test pieces having a swollen part of 5 mm or less is rated "Fair", and a sample with test pieces having a swollen part of more than 5 mm is rated "Bad".

(Peel Strength)

The peel strength (peeling strength or copper foil adhesive strength) of the metal foil on the surface of the metal-clad laminated plate was measured in accordance with JIS C 6481. Here, a metal-clad laminated plate having a width of 20 mm and a length of 100 mm was provided as a test piece, and a pattern having a width of 10 mm and a length of 100 mm was formed on the test piece by etching. The pattern was peeled at a speed of 50 mm/min by use of a tension tester ("AUTOGRAPH AGS-X" manufactured by Shimadzu Corporation), and the peeling strength (kgf/cm) was measured as a peel strength.

(Package Warpage Amount)

First, a flip chip (FC) was bonded to a substrate with a reinforcing material ("HCV5313HS" manufactured by Panasonic Corporation) to be mounted on the substrate, thereby producing a simple FC-mounted package (size: 16 mm×16 mm) for measurement of a package warpage amount. Here, a Si chip having a size of 15.06 mm×15.06 mm×0.1 mm on which 4356 solder balls (height: 80 μm) ware mounted was used as the FC. A metal-clad laminated plate from which a metal foil was removed was used as the substrate.

Next, for the FC-mounted package, warpage was measured on the basis of the shadow moire measurement theory by use of a warpage measuring device ("THERMOIRE PS200" manufactured by AKROMETRIX Co.). The package warpage amount was determined as a difference between the maximum value and the minimum value of the warpage amount when the FC-mounted package was heated from 25° C. to 260° C., and then cooled to 25° C.

TABLE 1

| | | | Examples | | | | Comparative examples | | |
|---|---|---|---|---|---|---|---|---|---|
| Blending raw materials and evaluation items | | | 1 | 2 | 3 | 4 | 1 | 2 | 3 |
| (A) | (A-1) Naphthalene-type epoxy resin | | 41.67 | 41.67 | 41.67 | 41.67 | 41.67 | 41.67 | 41.67 |
| | (A-2) Naphthalene-type phenolic hardener | | 28.33 | 28.33 | 28.33 | 28.33 | 28.33 | 28.33 | 28.33 |
| (B) | (B-1) Epoxy-modified acrylic resin (Mw: 300,000, epoxy value: 0.21 eq/kg) | | 30 | 30 | | | | | |
| | (B-2) Epoxy-modified acrylic resin (Mw: 500,000, epoxy value: 0.21 eq/kg) | | | | 30 | 30 | | | |
| | (B-3) Epoxy-modified acrylic resin (Mw: 500,000, epoxy value: 0.21 eq/kg) | | | | | | 30 | 30 | 30 |
| | Curing accelerator (imidazole) | | 0.04 | 0.04 | 0.04 | 0.04 | 0.04 | 0.04 | 0.04 |
| (C) | (C-1) Silica surface-treated with HTMS | | 50 | | | | 50 | | |
| | (C-2) Silica surface-treated with IPTES | | | 50 | 50 | | | 50 | |
| | (C-3) Untreated silica | | | | | 50 | | | 50 |
| | Total (parts by mass) | | 150 | 150 | 150 | 150 | 150 | 150 | 150 |
| Evaluation of physical properties | Peak top temperature (° C.) at which tan $\delta \geq 0.05$ | | 25 | 24 | 28 | 24 | 23 | 22 | 24 |
| | | | 258 | 256 | 258 | 258 | 258 | 259 | 258 |
| | Elastic modulus [GPa] | | 0.6 | 1.3 | 1.4 | 1.0 | 0.6 | 1.2 | 1.0 |

TABLE 1-continued

|  | Examples | | | | Comparative examples | | |
|---|---|---|---|---|---|---|---|
| Blending raw materials and evaluation items | 1 | 2 | 3 | 4 | 1 | 2 | 3 |
| Coefficient of thermal expansion [ppm/° C.] | 7 | 7.2 | 7.2 | 7.0 | 5.7 | 6.2 | 6.0 |
| Tensile elongation [%] | 24 | 16 | 17 | 20 | 24 | 22 | 23 |
| Tensile strength [MPa] | 55 | 72 | 70 | 60 | 42 | 45 | 43 |
| Test of heat resistance with moisture absorption (1 hour) | "Very Good" | "Very Good" | "Very Good" | "Very Good" | "Bad" | "Bad" | "Bad" |
| Test of heat resistance with moisture absorption (2 hours) | "Good" | "Very Good" | "Very Good" | "Good" | "Bad" | "Bad" | "Bad" |
| Test of heat resistance with moisture absorption (4 hours) | "Good" | "Very Good" | "Very Good" | "Good" | "Bad" | "Bad" | "Bad" |
| Peel strength [kgf/cm] | 0.5 | 0.5 | 0.5 | 0.5 | 0.5 | 0.5 | 0.5 |
| Package warpage amount [μm] | 480 | 485 | 480 | 475 | 440 | 460 | 455 |

It has been confirmed that in examples, warpage of the package can be reduced, and heat resistance with moisture absorption can be improved in comparison with comparative examples as is evident from Table 1.

What is claimed is:

1. A prepreg comprising a resin composition and a woven fabric base material, the resin composition comprising:
   (A) at least one of an epoxy resin having a naphthalene skeleton and a phenolic hardener having a naphthalene skeleton;
   (B) a polymer having the structures of formulae (1), (2) and (3) and having a weight-average molecular weight of from 200,000 to 850,000 inclusive; and
   (C) an inorganic filler:

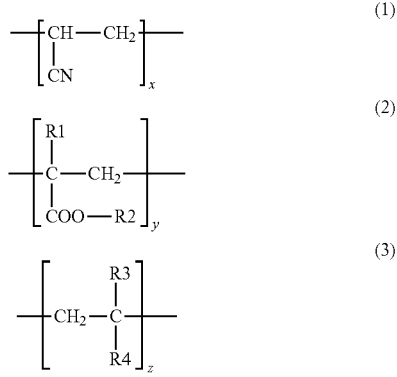

wherein x:y:z (molar fraction)=0:0.95:0.05 to 0.2:0.6:0.2 (where x+y+z≤1, 0<x≤0.2, 0.6≤y≤0.95, 0.05≤z≤0.2); R1 represents a hydrogen atom or a methyl group and R2 includes at least one of a glycidyl group and an epoxidized alkyl group among a hydrogen atom, an alkyl group, a glycidyl group and an epoxidized alkyl group in formula (2); and R3 represents a hydrogen atom or a methyl group and R4 represents Ph (phenyl group), —COOCH$_2$Ph or —COO(CH$_2$)$_2$Ph in formula (3).

2. The prepreg according to claim 1, wherein a ratio of a loss elastic modulus to a storage elastic modulus is 0.05 or more at a temperature of 60° C. or lower and at a temperature of 200° C. or higher in a cured state.

3. The prepreg according to claim 1, wherein a tensile elongation in a direction inclined by 45° with respect to a warp yarn or a weft yarn in the woven fabric base material is 5% or more in a cured state.

4. A metal-clad laminate plate comprising:
   an insulating layer that is a cured product of the prepreg according to claim 1; and
   a metal foil provided on the insulating layer.

5. A printed wiring board comprising:
   an insulating layer that is a cured product of the prepreg according to claim 1; and
   a conductive pattern provided on the insulating layer.

6. The prepreg according to claim 1, wherein an epoxy value of the polymer of component (B) is in the range of from 0.06 eq/kg to 0.8 eq/kg inclusive.

7. The prepreg according to claim 1, wherein the inorganic filler of component (C) is surface-treated with a silane coupling agent represented by formula (4):

(R6)Si (R5)$_3$     (4)

wherein R5 represents a methoxy group or an ethoxy group, and R6 represents an aliphatic alkyl group with a carbon number of from 3 to 18 inclusive, the aliphatic alkyl group having a methacryl group, a glycidyl group or an isocyanate group at an end thereof in formula (4).

* * * * *